(12) United States Patent
Weber et al.

(10) Patent No.: US 11,264,453 B2
(45) Date of Patent: Mar. 1, 2022

(54) METHODS OF DOPING FIN STRUCTURES OF NON-PLANAR TRANSISTOR DEVICES

(71) Applicant: Intel Corporation, Santa Clara, CA (US)

(72) Inventors: Cory E. Weber, Hillsboro, OR (US); Aaron D. Lilak, Beaverton, OR (US); Szuya S. Liao, Portland, OR (US); Aaron A. Budrevich, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/412,305

(22) Filed: May 14, 2019

(65) Prior Publication Data

US 2019/0267448 A1 Aug. 29, 2019

Related U.S. Application Data

(63) Continuation of application No. 15/757,251, filed as application No. PCT/US2015/052306 on Sep. 25, 2015.

(51) Int. Cl.
*H01L 29/66* (2006.01)
*H01L 29/06* (2006.01)
(Continued)

(52) U.S. Cl.
CPC ........ *H01L 29/0638* (2013.01); *H01L 21/223* (2013.01); *H01L 21/2253* (2013.01);
(Continued)

(58) Field of Classification Search
CPC .................. H01L 29/66803; H01L 29/785
See application file for complete search history.

(56) References Cited

U.S. PATENT DOCUMENTS 6,475,890 B1 11/2002 Yu
6,562,665 B1 5/2003 Yu
(Continued)

FOREIGN PATENT DOCUMENTS

CN 1881614 12/2006
CN 101183686 5/2008
(Continued)

OTHER PUBLICATIONS

Notice of Allowance from Taiwan Patent Application No. 105126926 dated Sep. 4, 2020, 3 pgs.
(Continued)

*Primary Examiner* — Trang Q Tran
(74) *Attorney, Agent, or Firm* — Essential Patents Group, LLP

(57) ABSTRACT

Methods and structures formed thereby are described relating to the doping non-planar fin structures. An embodiment of a structure includes a substrate, wherein the substrate comprises silicon, a fin on the substrate comprising a first portion and a second portion; and a dopant species, wherein the first portion comprises a first dopant species concentration, and the second portion comprises a second dopant species concentration, wherein the first dopant species concentration is substantially less than the second dopant species concentration.

19 Claims, 10 Drawing Sheets

(51) Int. Cl.
*H01L 21/223* (2006.01)
*H01L 21/225* (2006.01)
*H01L 21/265* (2006.01)
*H01L 21/266* (2006.01)
*H01L 21/3115* (2006.01)
*H01L 29/78* (2006.01)
*H01L 29/775* (2006.01)

(52) U.S. Cl.
CPC ........ *H01L 21/2254* (2013.01); *H01L 21/266* (2013.01); *H01L 21/2652* (2013.01); *H01L 21/31155* (2013.01); *H01L 29/0673* (2013.01); *H01L 29/66803* (2013.01); *H01L 29/785* (2013.01); *H01L 29/775* (2013.01)

(56) References Cited

U.S. PATENT DOCUMENTS

| | | |
|---|---|---|
| 7,420,230 B2 | 9/2008 | Tsuchiaki |
| 7,683,428 B2 | 3/2010 | Chidambarrao et al. |
| 8,264,032 B2 | 9/2012 | Yeh et al. |
| 8,679,906 B2 | 3/2014 | Cheng |
| 8,883,597 B2 | 11/2014 | Chang et al. |
| 9,184,233 B2 | 11/2015 | Van Dal |
| 9,390,981 B1 | 7/2016 | Basker et al. |
| 9,543,382 B1 | 1/2017 | Wu et al. |
| 10,056,380 B2 | 8/2018 | Ghani et al. |
| 2003/0193058 A1 | 10/2003 | Fried et al. |
| 2004/0256683 A1 | 12/2004 | Lee et al. |
| 2005/0019993 A1 | 1/2005 | Lee et al. |
| 2005/0161739 A1 | 7/2005 | Anderson et al. |
| 2006/0244051 A1 | 11/2006 | Izumida et al. |
| 2007/0134864 A1 | 6/2007 | Anderson et al. |
| 2007/0170474 A1 | 7/2007 | Kawasaki |
| 2008/0111185 A1 | 5/2008 | Cheng |
| 2008/0149984 A1 | 6/2008 | Chang et al. |
| 2008/0296632 A1 | 12/2008 | Moroz et al. |
| 2009/0095980 A1 | 4/2009 | Yu et al. |
| 2009/0101978 A1 | 4/2009 | Anderson et al. |
| 2010/0052059 A1 | 3/2010 | Lee |
| 2010/0183961 A1 | 7/2010 | Shieh et al. |
| 2010/0203734 A1 | 8/2010 | Shieh et al. |
| 2010/0264468 A1 | 10/2010 | Xu |
| 2010/0264497 A1 | 10/2010 | Chang et al. |
| 2011/0115031 A1 | 5/2011 | Park |
| 2011/0129990 A1 | 6/2011 | Mandrekar et al. |
| 2011/0171795 A1 | 7/2011 | Tsai et al. |
| 2011/0278676 A1 | 11/2011 | Cheng et al. |
| 2011/0317485 A1 | 12/2011 | Liaw et al. |
| 2012/0012932 A1 | 1/2012 | Perng et al. |
| 2012/0104472 A1 | 5/2012 | Xu et al. |
| 2012/0326219 A1 | 12/2012 | Lu et al. |
| 2013/0043536 A1 | 2/2013 | Rahim et al. |
| 2013/0102137 A1 | 4/2013 | Jeng |
| 2013/0119453 A1 | 5/2013 | Wann et al. |
| 2013/0126951 A1 | 5/2013 | Pawlak |
| 2013/0244392 A1 | 9/2013 | Oh et al. |
| 2013/0285153 A1 | 10/2013 | Lee et al. |
| 2013/0307088 A1 | 11/2013 | Yang et al. |
| 2013/0328134 A1 | 12/2013 | Chuang et al. |
| 2013/0334616 A1 | 12/2013 | Yu et al. |
| 2014/0061820 A1 | 3/2014 | Reznicek et al. |
| 2014/0065782 A1 | 3/2014 | Lu et al. |
| 2014/0103450 A1 | 4/2014 | Cheng |
| 2014/0191318 A1 | 7/2014 | Lin et al. |
| 2014/0199849 A1 | 7/2014 | Mani et al. |
| 2014/0239347 A1 | 8/2014 | Dal |
| 2014/0264485 A1 | 9/2014 | Li et al. |
| 2015/0021710 A1 | 1/2015 | Hsu et al. |
| 2015/0054089 A1 | 2/2015 | Hong et al. |
| 2015/0069474 A1 | 3/2015 | Ching et al. |
| 2015/0079752 A1 | 3/2015 | Wu et al. |
| 2015/0155383 A1 | 6/2015 | Chang et al. |
| 2015/0243784 A1 | 8/2015 | Morin |
| 2015/0279933 A1 | 10/2015 | Xiao et al. |
| 2015/0279995 A1 | 10/2015 | Maeda et al. |
| 2015/0303218 A1 | 10/2015 | Loubet et al. |
| 2015/0364579 A1 | 12/2015 | Jangjian et al. |
| 2015/0364580 A1 | 12/2015 | Jangjian et al. |
| 2015/0364593 A1 | 12/2015 | Jangjian et al. |
| 2015/0372139 A1 | 12/2015 | Wei et al. |
| 2016/0020210 A1 | 1/2016 | Liaw |
| 2016/0043225 A1 | 2/2016 | Ching et al. |
| 2016/0056156 A1 | 2/2016 | Ghani et al. |
| 2016/0087053 A1 | 3/2016 | Kim et al. |
| 2016/0099245 A1 | 4/2016 | Cheng et al. |
| 2016/0104776 A1 | 4/2016 | Ching et al. |
| 2016/0111336 A1 | 4/2016 | Chang et al. |
| 2016/0163604 A1 | 6/2016 | Xie et al. |
| 2016/0181247 A1 | 6/2016 | Anderson et al. |
| 2016/0181360 A1 | 6/2016 | Wang |
| 2016/0181366 A1 | 6/2016 | Oh et al. |
| 2016/0190137 A1 | 6/2016 | Tsai et al. |
| 2016/0190306 A1 | 6/2016 | Xie et al. |
| 2016/0204215 A1 | 7/2016 | Chang et al. |
| 2016/0211326 A1* | 7/2016 | Tsai .................. H01L 21/26586 |
| 2017/0062427 A1 | 3/2017 | Basker et al. |
| 2017/0213835 A1 | 7/2017 | Donaton et al. |
| 2017/0229578 A1 | 8/2017 | Pandey et al. |
| 2018/0053761 A1 | 2/2018 | Liou et al. |
| 2018/0158811 A1 | 6/2018 | Subhash et al. |

FOREIGN PATENT DOCUMENTS

| | | |
|---|---|---|
| JP | 2007201021 | 8/2007 |
| KR | 20110025075 | 3/2011 |
| TW | 200905875 | 2/2009 |
| TW | 201434156 | 9/2014 |
| WO | 2005079182 | 9/2005 |
| WO | 2014204477 | 12/2014 |

OTHER PUBLICATIONS

Non-Final Office Action for U.S. Appl. No. 15/757,251 dated Jul. 17, 2019.
Office Action from Taiwan Patent Application No. 105126926 dated Jan. 15, 2020, 15 pgs.
Final Office Action from U.S. Appl. No. 15/757,251 dated Dec. 11, 2019, 16 pgs.
Non-Final Office Action from U.S. Appl. No. 15/757,251 dated Jun. 24, 2020, 10 pgs.
International Preliminary Report on Patentability from PCT/US2015/052306 dated Apr. 5, 2018, 12 pg.
International Search Report and Written Opinion from PCT/US2015/052306 dated Jun. 15, 2016, 13 pgs.
Non-Final Office Action from U.S. Appl. No. 15/757,251 dated Sep. 27, 2018, 18 pgs.
Notice of Allowance from U.S. Appl. No. 15/757,251 dated Jan. 3, 2019, 9 pgs.
Restriction Requirement for U.S. Appl. No. 15/757,251 dated Aug. 10, 2018, 9 pgs.
Notice of Allowance from U.S. Appl. No. 15/757,251 dated Sep. 22, 2021, 8 pgs.

* cited by examiner

METHODS OF DOPING FIN STRUCTURES OF NON-PLANAR TRANSISTOR DEVICES

CLAIM OF PRIORITY

This application is a continuation of, and claims priority to, U.S. patent application Ser. No. 15/757,251, filed on Mar. 2, 2018 and titled "METHODS OF DOPING FIN STRUCTURES OF NON-PLANAR TRANSISTOR DEVICES", which is a National Stage Entry of, and claims priority to, PCT Application No. PCT/US2015/052306, filed on Sep. 25, 2015 and titled "METHODS OF DOPING FIN STRUCTURES OF NON-PLANAR TRANSISTOR DEVICES", which is incorporated by reference in its entirety for all purposes.

BACKGROUND OF THE INVENTION

Microelectronic devices, such as non-planar transistor devices, may be subject to sub-fin leakage issues, which can increase device power consumption. Typical methods utilized to reduce sub-fin leakage may degrade electrical carrier (electron/hole) mobility, which may then degrade drive current and device performance.

BRIEF DESCRIPTION OF THE DRAWINGS

While the specification concludes with claims particularly pointing out and distinctly claiming certain embodiments, the advantages of these embodiments can be more readily ascertained from the following description of the invention when read in conjunction with the accompanying drawings in which:

DETAILED DESCRIPTION OF THE PRESENT INVENTION

Figure 1:
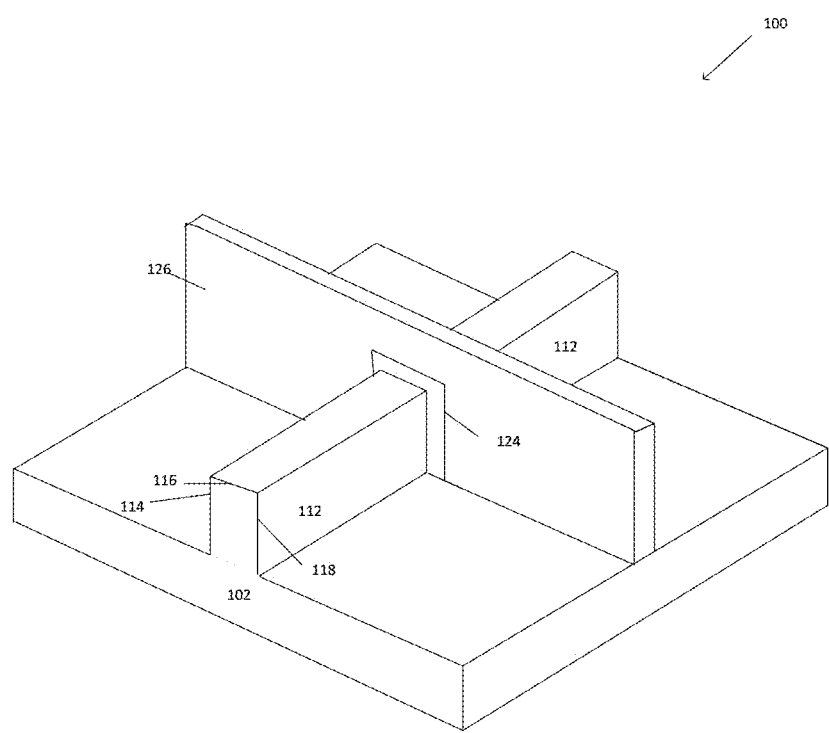
FIG. 1 represents a perspective view of a structure according to embodiments.

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments. The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views.

Implementations of the embodiments herein may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope.

A plurality of transistors, such as metal-oxide-semiconductor field-effect transistors (MOSFET or simply MOS transistors), may be fabricated on the substrate. In various implementations, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors.

Each transistor may include a gate stack formed of at least two layers, for example, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc.

The gate electrode layer may be formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

Source and drain regions may be formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process.

In an embodiment, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Methods and associated structures of forming microelectronic device structures, such as methods of forming doping fin structures of non-planar devices. Those methods/structures may include providing a free standing fin on a substrate, wherein the free standing fin comprises a first portion and a second portion, wherein the first portion does not comprise an adjacent dielectric material, and wherein the second portion comprises an adjacent dielectric material, and then implanting the free standing fin structure, wherein the second portion of the free standing fin structure comprises a higher dopant concentration than the first free standing fin portion. The fin doping methods herein reduce sub-fin leakage while maintaining device mobility.

FIG. 1 is a perspective view of a non-planar transistor 100, including at least one gate formed on at least one transistor fin, which are formed on a microelectronic substrate 102. In an embodiment, the microelectronic substrate 102 may be a monocrystalline silicon substrate. The microelectronic substrate 102 may also be other types of substrates, such as silicon-on-insulator ("SOI"), germanium, gallium arsenide, indium antimonide, lead telluride, indium arsenide, indium phosphide, gallium arsenide, gallium antimonide, and the like, any of which may be combined with silicon.

The non-planar transistor, shown as a tri-gate transistor, may include at least one non-planar transistor fin 112. The non-planar transistor fin 112 may have a top surface 114 and a pair of laterally opposite sidewalls, sidewall 116 and opposing sidewall 118, respectively.

As further shown in FIG. 1, at least one non-planar transistor gate electrode 126 may be formed over the non-planar transistor fin 112. The non-planar transistor gate electrode 126 may be fabricated by forming a gate dielectric layer 124 on or adjacent to the non-planar transistor fin surface 114 and on or adjacent to the non-planar transistor fin sidewall 116 and the opposing non-planar transistor fin sidewall 118. The gate electrode 126 may be formed on or adjacent the gate dielectric layer 124. In one embodiment of the present disclosure, the non-planar transistor fin 112 may run in a direction substantially perpendicular to the non-planar transistor gate 122. The gate dielectric layer 124 may be formed from any well-known gate dielectric material, including but not limited to silicon dioxide ($SiO_2$), silicon oxynitride ($SiO_xN_y$), silicon nitride ($Si_3N_4$), and high-k dielectric materials.

The gate electrode 126 may be formed by various methods, according to the particular application. A source region and a drain region (not shown in FIG. 1) may be formed in the non-planar transistor fin 112 on opposite sides of the gate electrode 126. In one embodiment, the source and drain regions may be formed by doping the non-planar transistor fins 112. In another embodiment, the source and drain regions may be formed by removing portion of the non-planar transistor fins 112 and replacing these portions with appropriate material(s) to form the source and drain regions. In still another embodiment, the source and drain regions may be formed by exitaxially growing doped or undoped strain layers on the fins 112. Other methods or combination of methods, may be utilized to form the source/drain regions, according to the particular application.

Figure 2A:
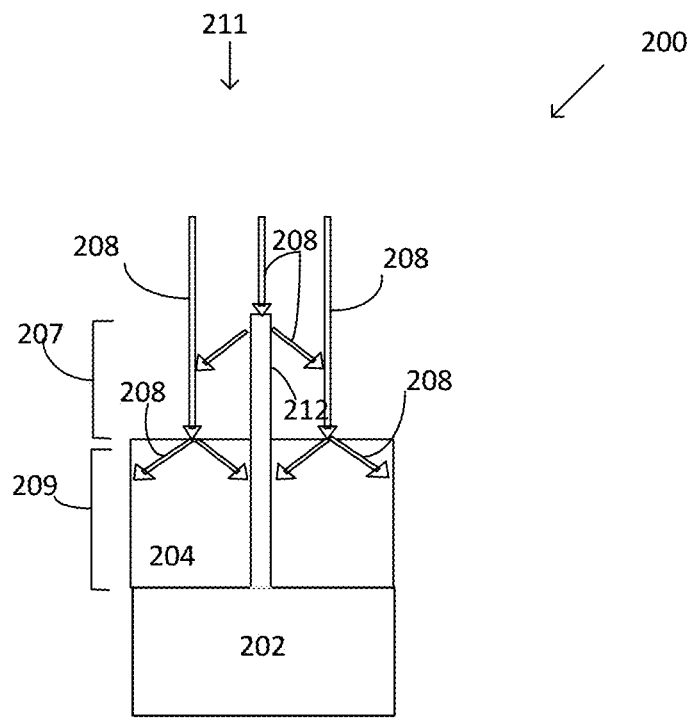
FIGS. 2a-2d represent side cross sectional views of structures according to embodiment.

In FIGS. 2a-2d, side cross sectional views of structures and methods of doping free standing fins are depicted. In FIG. 2a, a substrate 202, such as a silicon substrate, for example, may comprise a fin 212. The fin 212 and substrate 202 may comprise a portion of a device 200, such as a non-planar transistor, and may comprise a tri-gate transistor, in an embodiment. A dielectric material 204, such as a silicon dioxide and/or a silicon nitride material for example, may be disposed on the substrate 202. The fin 212 may comprise a first portion 207 that may not comprise an adjacent dielectric material. The first portion 207 of the fin 212 may comprise a free standing fin portion 207. A second portion 209 of the fin structure 212, may be disposed adjacent to the dielectric material 204, and may comprise a sub-fin portion 209.

An implant process 211, may be employed to introduce a dopant species/ions 208 into the fin 212, and may serve to dope the fin 212. In an embodiment, dopants species 208 may include, but are not limited to, boron, aluminum, antimony, phosphorous, arsenic, silicon, zinc, beryllium, magnesium and combinations thereof. The dopant species 208 may comprise any suitable dopant species, according to the particular application. The implant process 211 may result in dopant species scattering about the free standing fin 212 and into the dielectric 204. Additionally, dopant species 208 from the implant process 211 may scatter from the dielectric 204 and into the second portion/sub fin 209 of the fin 212, and may serve to increase the dopant species concentration within the sub fin portion 209. In this manner, a doping concentration within tri-gate fins of a trigate transistor may be reduced, while maintaining a high doping concentration in the tri-gate sub fin region. In an embodiment, ions implanted into the fin 212 may scatter laterally out of the fin, but since there is no dielectric around the first fin portion 207, this effect does not occur, and the first fin portion 207 doping concentration remains low, relative to the doping concentration of the second portion 209.

Figure 2B:
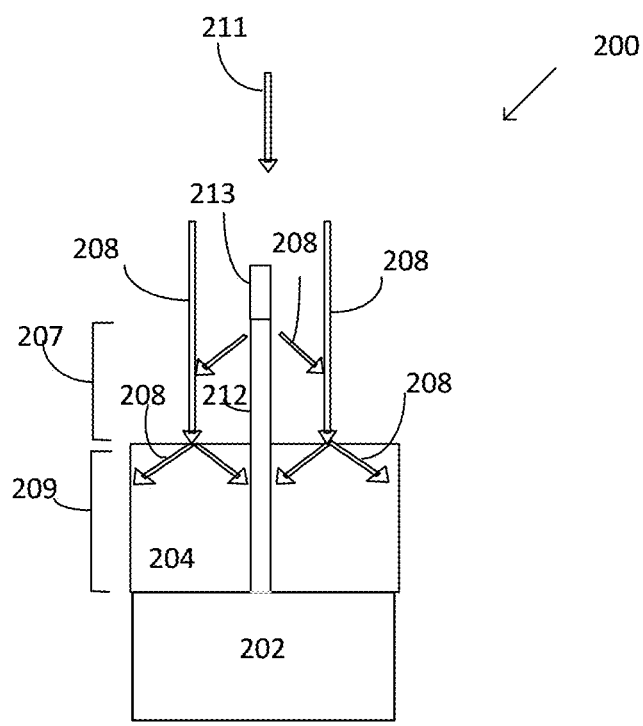

However, because the dielectric material 204 surrounds the sub fin portion 207 of the fin 212, the implanted ions scatter from the dielectric material 204 into the sub fin region 209, thus increasing the sub fin 209 doping. The freestanding fin implant process reduces fin doping in the first portion 207 of the fin 212 and increases sub fin 209 doping. Both of these results improve transistor operation. In another embodiment, a cap 213 may be formed/disposed on a top surface of the fin 122 (FIG. 2b). The cap 213 may serve to further deflect the dopant species 208 from the first portion 207 of the fin 212. The freestanding fin implant may be further improved by capping the fin with another film, which reduces the amount of ions that are implanted into and that otherwise remain in the fin 212. The cap 213 may comprise any suitable material, such as a dielectric material, for example, in an embodiment.

Figure 2C:
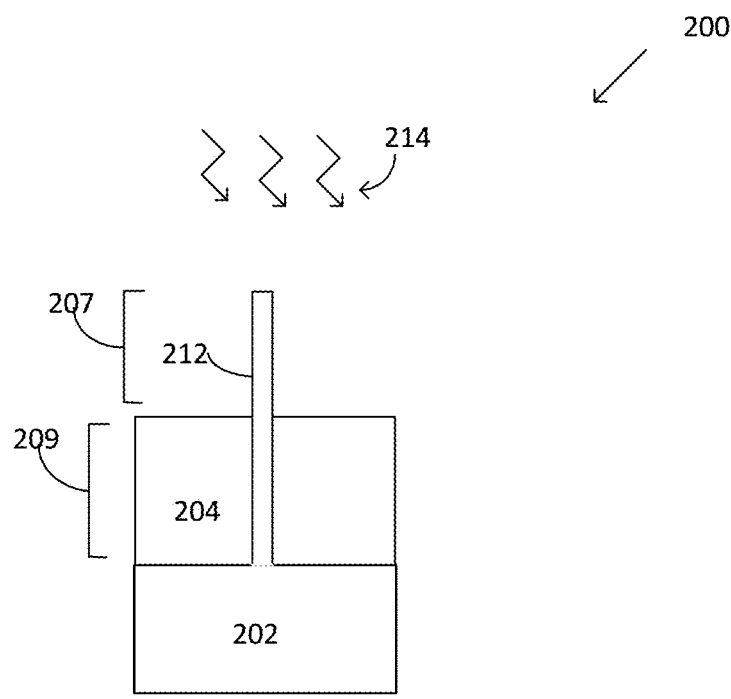
Figure 2D:
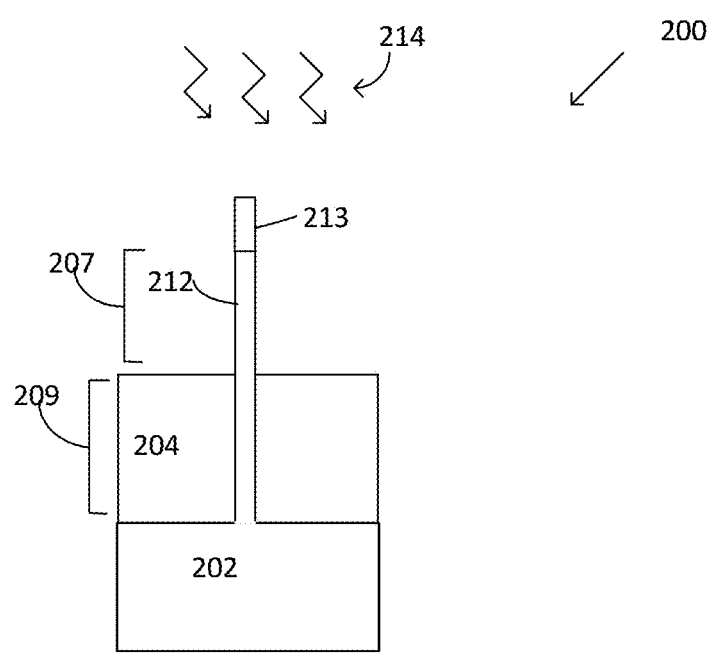

FIGS. 2c-2d depict another embodiment, wherein an anneal process 214 is employed to drive the implanted dopant species 208 further into the fin structure 212. In an embodiment, dopants in the uncovered first portion 207 of the fin 212 may evaporate from the silicon fin 212 during such an anneal process. However, dopants in the second portion 209 of the fin 212 that are adjacent to the dielectric material 204, may retain the dopant species within the second portion 209 of the fin 212. A cap 213 (FIG. 2d) may be utilized to prevent fin deformation during the anneal 214 process. In an embodiment, the cap 213 may prevent surface diffusion of silicon atoms from one side of the fin 212 to the other. Both the implant into free standing fins and anneals with free standing fins may be combined, resulting in fins 212 comprising little to no channel doping. The use of the cap 213 may or may not be employed, however the use of a cap may further reduce the dopant concentration in the fin, as well as reducing the risk of fin deformation during annealing. In an embodiment, the dielectric material 204 may comprise a higher dopant concentration than the fin 207.

Figure 2E:
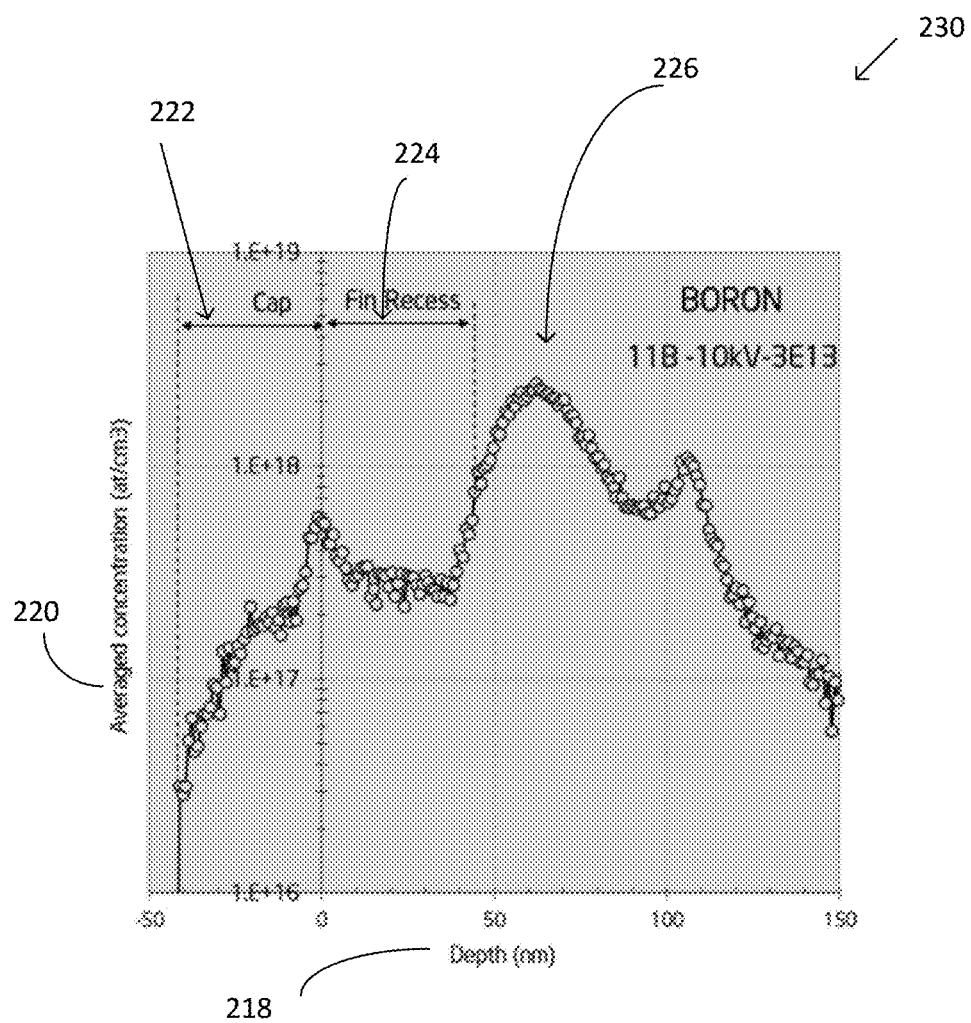
FIG. 2e represents a graph according to embodiments.

In an embodiment, the dopant concentration of the sub fin region 209 may comprise an order of magnitude difference from the dopant concentration of the fin portion 207 by employing the free standing implant and/or anneal processes depicted herein. For example, a graph 230 of secondary ion mass spectroscopy (SIMS) measurements of boron implants into freestanding fins is depicted in FIG. 2e. The average dopant species concentration (atoms/cm$^3$) 220 is plotted against the depth 218 into the fin, in nanometers. The graph 230 depicts a cap portion 222, a fin recess portion/first fin portion 224, and a subfin portion 226. The boron concentration in the first portion/fin recess 224 comprises a lower boron concentration than the sub fin region 226, which comprises nearly an order of magnitude higher boron concentration than the first fin portion 224.

Figure 3A:
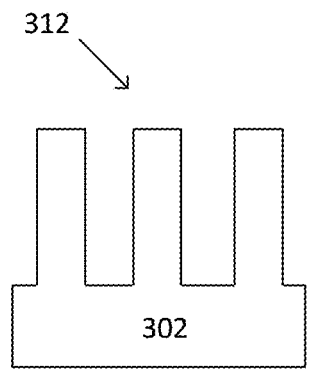
FIG. 3a-3h represent side cross sectional views of a structures according to embodiments.
Figure 3B:
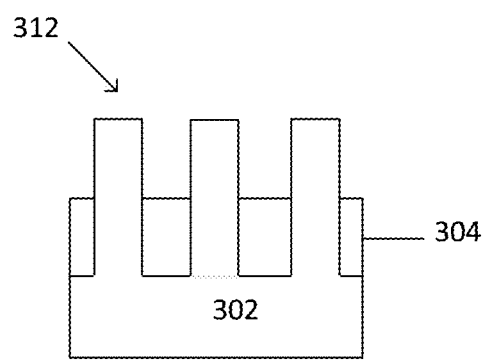
Figure 3C:
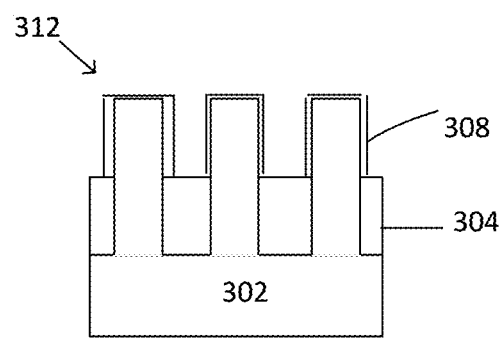

In another embodiment, blocking layers may be used, wherein conformal implant technology and blocking layers may restrict implantation of doping into the fin. The doping profile of the fin may also be engineered with anneals. FIG. 3a depicts patterned fins 312 on a substrate 302, such as patterned silicon fins 306 from a non-planar device. A dielectric material 304 may be formed on the substrate 302 and between the fins 312, and may be recessed (FIG. 3b). Another dielectric material/blocking material 308, such as a silicon nitride material, for example, may be formed on a top/exposed surface of the fins 312 (FIG. 3c). In an embodiment, the dielectric material may be selectively formed the silicon fins, such as by a process of annealing in an ammonia gas, for example.

Figure 3D:
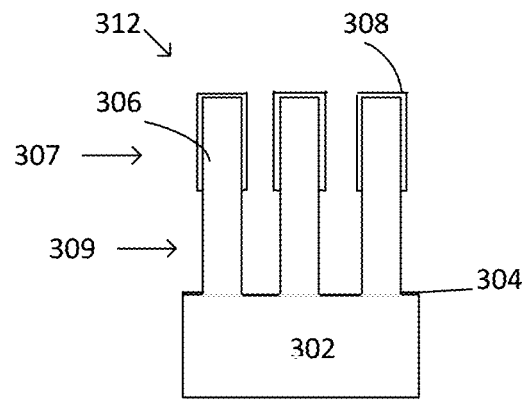
Figure 3E:
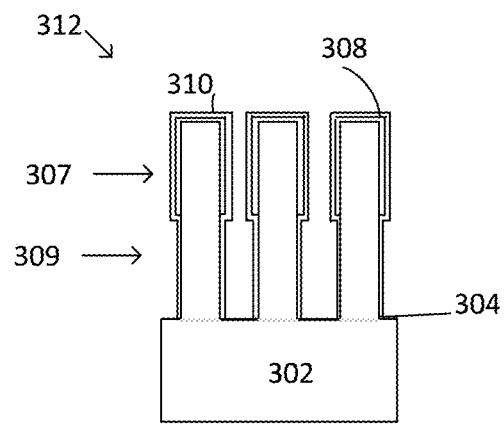
Figure 3F:
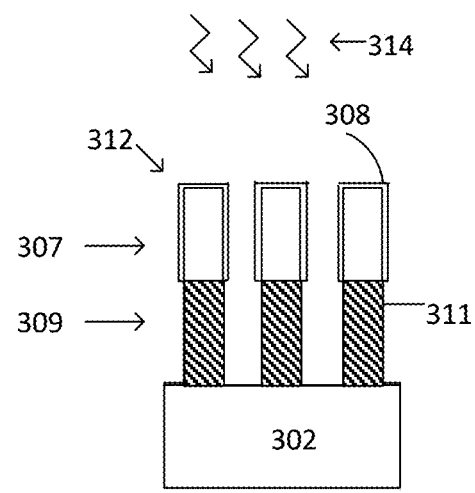
Figure 3G:
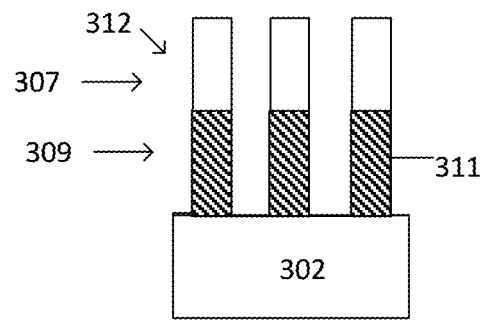
Figure 3H:
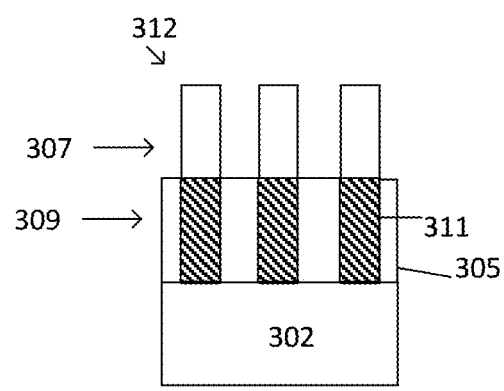

The dielectric material 304 between the fins 312 may be recessed, wherein the subfin 309 may be exposed (FIG. 3d), and a highly doped material 310 may be formed on the sidewalls of the fin 312 (FIG. 3e). In an embodiment, the highly doped material 310 may be formed by utilizing a deposition process, such as a plasma implant (PIA) process, or any other suitable process, for example. The highly doped material 310 may comprise a dopant specie(s) that may vary according to the particular application. The dopant material 310 may be annealed with an anneal process 314 to drive the dopant species into the subfin region/portion 309, after which the dopant material is etched away (FIG. 3f). The dielectric material 308 may then be removed, and an insulating material 305 may be formed around the sub fin 309 (FIGS. 3g-3h). In an embodiment, the subfin 209 may comprise a greater dopant concentration than the fin area 207.

Figure 4:
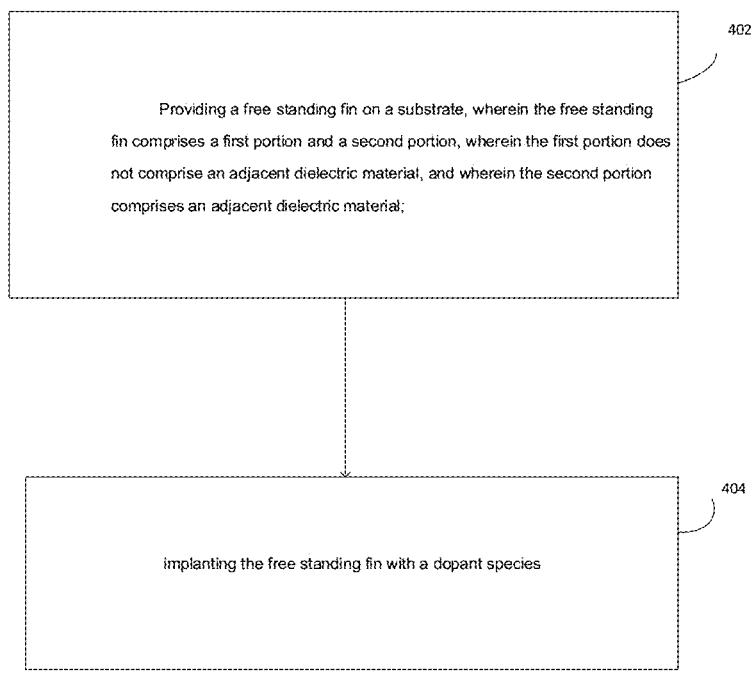
FIG. 4 represents a flow chart of a method according to embodiments.

FIG. 4 depicts a method according to embodiments herein. At step 402, a free standing fin on a substrate may be provided, wherein the free standing fin comprises a first portion and a second portion, wherein the first portion does not comprise an adjacent dielectric material, and wherein the second portion comprises an adjacent dielectric material. At step 404, the free standing fin may be implanted with a dopant species.

In an embodiment, the structures of the embodiments herein may be coupled with any suitable type of structures capable of providing electrical communications between a microelectronic device, such as a die, disposed in package structures, and a next-level component to which the package structures may be coupled (e.g., a circuit board).

The device structures, and the components thereof, of the embodiments herein may comprise circuitry elements such as logic circuitry for use in a processor die, for example. Metallization layers and insulating material may be included in the structures herein, as well as conductive contacts/bumps that may couple metal layers/interconnects to external devices/layers. The structures/devices described in the various figures herein may comprise portions of a silicon logic die or a memory die, for example, or any type of suitable microelectronic device/die. In some embodiments the devices may further comprise a plurality of dies, which may be stacked upon one another, depending upon the particular embodiment. In an embodiment, the die(s) may be partially or fully embedded in a package structure.

The various embodiments of the device structures included herein may be used for system on a chip (SOC) products, and may find application in such devices as smart phones, notebooks, tablets, wearable devices and other electronic mobile devices. In various implementations, the package structures may be included in a laptop, a netbook, a notebook, an ultrabook, a smartphone, a tablet, a personal digital assistant (PDA), an ultra mobilePC, a mobile phone, a desktop computer, a server, a printer, a scanner, a monitor, a set-top box, an entertainment control unit, a digital camera, a portable music player, or a digital video recorder, and wearable devices. In further implementations, the package devices herein may be included in any other electronic devices that process data.

Figure 5:
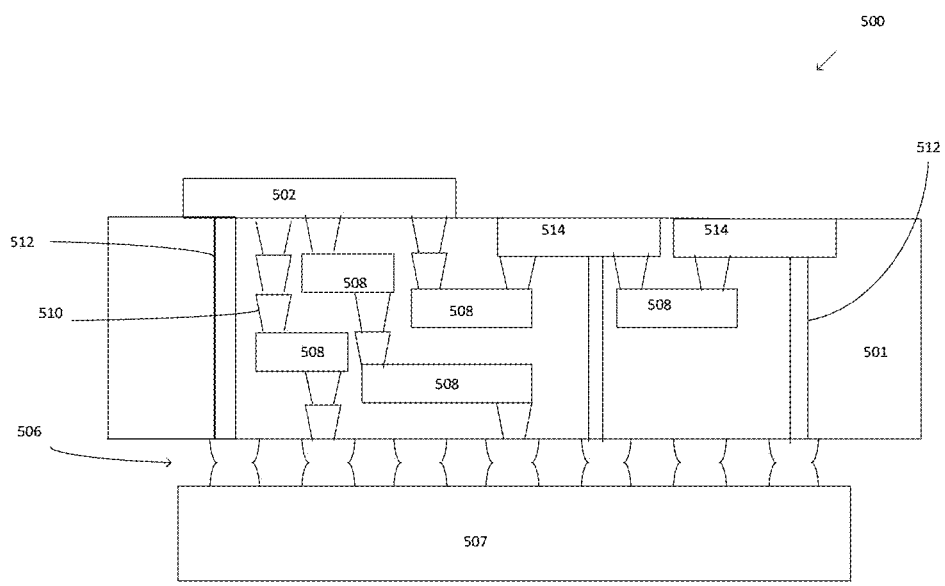
FIG. 5 represents an interposer implementing one or more embodiments.

FIG. 5 illustrates a device 500 that includes one or more embodiments of the invention. The device 500 may include interposer 501, which may comprise an intervening substrate used to bridge a first substrate 502 to a second substrate 504. The first substrate 502 may be, for instance, an integrated circuit die, and may or may not include embodiments of the self-aligned via described structures herein. The second substrate 504 may be, for instance, a memory module, a computer motherboard, or another integrated circuit die, and may or may not include embodiments of the self-aligned via described structures herein. Generally, the purpose of an interposer 501 is to spread a connection to a wider pitch or to reroute a connection to a different connection.

For example, an interposer 501 may couple an integrated circuit die to a ball grid array (BGA) 706 that can subsequently be coupled to the second substrate 504. In some embodiments, the first and second substrates 502/504 are attached to opposing sides of the interposer 501. In other embodiments, the first and second substrates 502/504 are attached to the same side of the interposer 501. And in further embodiments, three or more substrates are interconnected by way of the interposer 501.

The interposer 501 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials. The interposer may include metal interconnects 508 and vias 510, including but not limited to through-silicon vias (TSVs) 512. The interposer 501 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 501. In accordance with embodiments, apparatuses or processes disclosed herein may be used in the fabrication of interposer 501.

Figure 6:
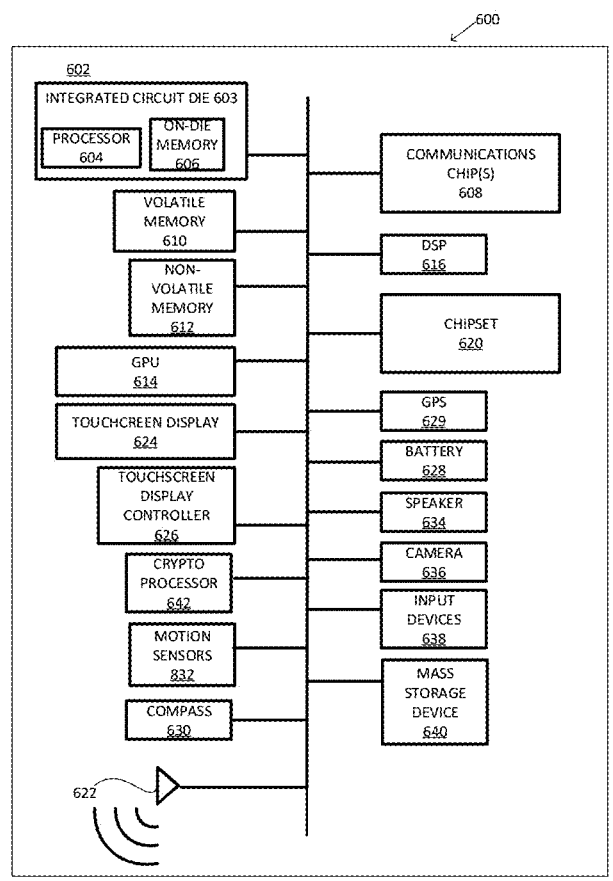
FIG. 6 represents a schematic of a system according to embodiments.

FIG. 6 is a schematic of a computing device 600 according to an embodiment. In an embodiment, the computing device 600 houses a board 602, such as a motherboard 602 for example. The board 602 may include a number of components, including but not limited to a processor 604, and an on-die memory 806, that may be communicatively coupled with an integrated circuit die 603, and at least one communication chip 608. The processor 604 may be physically and electrically coupled to the board 602. In some implementations the at least one communication chip 608 may be physically and electrically coupled to the board 602. In further implementations, the communication chip 606 is part of the processor 604.

Depending on its applications, computing device 600 may include other components that may or may not be physically and electrically coupled to the board 602, and may or may not be communicatively coupled to each other. These other components include, but are not limited to, volatile memory (e.g., DRAM) 610, non-volatile memory (e.g., ROM) 612, flash memory (not shown), a graphics processor unit (GPU) 614, a digital signal processor (DSP) 616, a crypto processor 642, a chipset 820, an antenna 622, a display 624 such as a touchscreen display, a touchscreen controller 626, a battery 628, an audio codec (not shown), a video codec (not shown), a global positioning system (GPS) device 629, a compass 630, accelerometer, a gyroscope and other inertial sensors 632, a speaker 634, a camera 636, and a mass storage device (such as hard disk drive, or solid state drive) 640, compact disk (CD) (not shown), digital versatile disk (DVD) (not shown), and so forth). These components may be connected to the system board 602, mounted to the system board, or combined with any of the other components.

The communication chip 608 enables wireless and/or wired communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 608 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 600 may include a plurality of communication chips 608. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. The term "processor" may refer to any device or portion of a device that processes electronic data from registers and/or memory to transform that electronic data into other electronic data that may be stored in registers and/or memory.

In various implementations, the computing device 600 may be a laptop, a netbook, a notebook, an ultrabook, a smartphone, a tablet, a personal digital assistant (PDA), an ultra mobile PC, a wearable device, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

EXAMPLES

Example 1 is a microelectronic structure comprising a substrate, wherein the substrate comprises silicon; a fin comprising a first portion and a second portion; and a dopant species, wherein the first portion comprises a first dopant species concentration, and the second portion comprises a second dopant species, wherein the first dopant species concentration is substantially less than the second dopant species concentration.

In Example 2, the structure of Example 1 including wherein the dopant species comprises one of a p type or an n type dopant species.

In Example 3, the structure of Example 1 including wherein the first portion comprises a first adjacent dielectric material, and the second portion comprises a second dielectric material, wherein the second dielectric material comprises a dopant concentration about an order of magnitude greater than the first dielectric material.

In Example 4, the structure of Example 1 including wherein the structure comprises a portion of a non-planar transistor structure.

In Example 5, the structure of Example 1 including wherein the structure comprises a portion of a lightly doped channel tri-gate transistor.

In Example 6, the structure of Example 1 including wherein the dopant concentration of the first portion is about an order of magnitude less than the dopant concentration of the second portion.

In Example 7, the structure of Example 1 including wherein the fin comprises a silicon fin structure.

In Example 8 the structure of Example 1 further comprising a gate electrode adjacent a source/drain region, wherein the gate electrode is on a portion of the fin.

Example 9 is a method comprising: providing a free standing fin on a substrate, wherein the free standing fin comprises a first portion and a second portion, wherein the first portion does not comprise an adjacent dielectric material, and wherein the second portion comprises an adjacent dielectric material; and implanting the free standing fin with a dopant species.

In Example 10, The method of Example 9 further comprising wherein the dopant species scatter out of the first portion of the fin during the implanting.

In Example 11, the method of Example 9 wherein the dopant species scatter from the dielectric material adjacent the second portion into the second portion of the free standing fin.

In Example 12, the structure of Example 9 wherein the first portion comprises a lower dopant concentration of the dopant species than the second portion.

In Example 13, the method of Example 9 wherein the fin structure is annealed.

In Example 14, the structure of Example 13 further comprising wherein the first portion comprises a cap on a top surface of the first portion.

In Example 15, the method of Example 13 wherein the dopant species in the first portion evaporate from the first portion.

In Example 16, the method of Example 13 further comprising wherein the dopants in the dielectric adjacent the second portion are diffused into the sub fin portion.

Example 17 is a method of forming a microelectronic structure, comprising: providing a substrate, wherein the substrate comprises silicon; forming a free standing fin on the substrate, wherein the free standing fin comprises a first portion and a second portion; forming a blocking material on the first portion; forming a dopant material on the second portion; and annealing the free standing fin.

In Example 18 the method of Example 17 further comprising wherein the blocking material is selectively formed on the first portion.

In Example 19, the method of Example 18 further comprising wherein the blocking material is removed from the free standing fin subsequent to the annealing.

In Example 20, the method of Example 17 wherein a dielectric material is formed adjacent the second portion of the free standing fin subsequent to the annealing.

In Example 21 the method of Example 17 further comprising wherein the second portion comprises a higher dopant concentration than the first portion of the free standing fin.

In Example 22 the method of Example 17, further comprising wherein the dopant material comprises a dopant species that is selected from the group consisting of boron, phosphorus, arsenic and phosphorus.

In Example 23, the method of Example 17 further comprising wherein the free standing fin comprises a portion of one of a FINFET, a tri-gate, or a planar transistor structure.

In Example 24 the method of Example 17 further comprising wherein the free standing fin comprises a gate electrode adjacent to the free standing fin.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus the embodiments are not limited to the structures described herein.

What is claimed is:

1. A transistor structure, comprising:
a fin over a substrate, the fin comprising silicon and including a first portion over a second portion that interfaces with the first portion at an interface therebetween, wherein the second portion is between the first portion and the substrate, and wherein the fin comprises a dopant species, a concentration of the dopant species increasing from a minimum concentration in the first portion of the fin to a peak concentration in the second portion of the fin, the peak concentration being within 25 nm of the interface between the first and second portions;
a gate stack laterally adjacent to a sidewall of the first portion of the fin, and absent from a sidewall of the second portion of the fin;
a source and drain on opposite sides of the gate stack, and electrically coupled to the first portion of the fin; and
a dielectric material laterally adjacent to the second portion of the fin, wherein at least a portion of the dielectric material laterally adjacent to the second portion of the fin comprises the dopant species at a concentration exceeding the minimum concentration.

2. The transistor structure of claim 1, wherein the concentration of the dopant species within the fin decreases from the peak concentration to a lower concentration that is between the minimum concentration and the peak concentration.

3. The transistor structure of claim 2, wherein the first portion of the fin is no more than 50 nm in height, and the concentration of the dopant species within the fin increases from the minimum concentration to the peak concentration within 15 nm of the interface between the first portion and the second portion.

4. The transistor structure of claim 3, wherein the minimum concentration is less than $3e17$ atoms/cm$^3$.

5. The transistor structure of claim 3, wherein the peak concentration within 75 nm below a top surface of the fin.

6. The transistor structure of claim 5, wherein the concentration of the dopant species within the fin decreases from the peak concentration to the lower concentration within 100 nm below the top surface of the fin, and wherein the concentration of dopant species within the fin increases with proximity to the substrate from the lower concentration.

7. The transistor structure of claim 2, wherein the minimum concentration is less than $1e18$ atoms/cm$^3$.

8. The transistor structure of claim 7, wherein the minimum concentration is less than $5e17$ atoms/cm$^3$.

9. The transistor structure of claim 8, wherein the peak concentration is more than $1e18$ atoms/cm$^3$.

10. The transistor structure of claim 9, wherein the lower concentration is less than $1e18$ atoms/cm$^3$.

11. The transistor structure of claim 10, wherein the peak concentration is more than $2e18$ atoms/cm$^3$, and the lower concentration is less than $8e17$ atoms/cm$^3$.

12. The transistor structure of claim 1, wherein the dopant species comprises boron or arsenic.

13. The transistor structure of claim 1, wherein the concentration of the dopant species within the fin decreases to the minimum concentration from a higher concentration proximal to a top surface of the fin.

14. The transistor structure of claim 13, wherein the higher concentration is at least $3e18$ atoms/cm$^3$, and wherein the minimum concentration is less than $5e17$ atoms/cm$^3$.

15. The transistor structure of claim 1, wherein:
the dielectric material is between the gate electrode and the substrate.

16. A transistor structure, comprising:
a fin over a substrate, the fin comprising silicon and including a first portion over a second portion that interfaces with the first portion at an interface therebetween, and wherein the second portion is between the first portion and the substrate;

a gate stack adjacent to a sidewall of a first portion of the fin;

a source and drain on opposite sides of the gate stack and electrically coupled to the first portion of the fin, wherein the fin comprises a dopant species that has a concentration minimum within the first portion of the fin, and a concentration peak within the second portion, the concentration peak within 25 nm of the interface, and the concentration minimum within 15 nm of the interface; and a fin isolation dielectric laterally adjacent to the second portion of the fin, wherein at least a portion of the fin isolation dielectric laterally adjacent to the second portion of the fin comprises the dopant species at a concentration exceeding the minimum concentration.

17. The transistor structure of claim 16, wherein the concentration peak is at least 2e18 atoms/cm$^3$.

18. The transistor structure of claim 17, wherein a concentration of the dopant species within the fin decreases to the minimum concentration from a higher concentration proximal to a top surface of the fin.

19. The transistor structure of claim 18, wherein the higher concentration is at least 3e18 atoms/cm$^3$, and wherein the minimum concentration is less than 5e17 atoms/cm$^3$.

* * * * *